US006995700B2

(12) United States Patent
Roger et al.

(10) Patent No.: US 6,995,700 B2
(45) Date of Patent: Feb. 7, 2006

(54) HIGH-RESOLUTION DIGITAL-TO-ANALOG CONVERTER

(75) Inventors: Frédéric Roger, München (DE); Ralf-Rainer Schledz, Zolling (DE)

(73) Assignee: Infineon Technologies AG, Munich (DE)

( * ) Notice: Subject to any disclaimer, the term of this patent is extended or adjusted under 35 U.S.C. 154(b) by 19 days.

(21) Appl. No.: 10/493,298

(22) PCT Filed: Jul. 18, 2002

(86) PCT No.: PCT/DE02/02652

§ 371 (c)(1),
(2), (4) Date: Nov. 19, 2004

(87) PCT Pub. No.: WO03/039005

PCT Pub. Date: May 8, 2003

(65) Prior Publication Data

US 2005/0062629 A1 Mar. 24, 2005

(30) Foreign Application Priority Data

Oct. 29, 2001 (DE) ................ 101 53 309

(51) Int. Cl.
*H03M 1/66* (2006.01)
(52) U.S. Cl. .................... 341/144
(58) Field of Classification Search .......... 341/141, 341/162, 155, 152, 144, 145, 121, 131, 159, 341/156; 318/592, 604, 614, 666, 603, 593, 318/595, 467; 360/77, 75; 375/238
See application file for complete search history.

(56) References Cited

U.S. PATENT DOCUMENTS

| 4,868,571 | A |   | 9/1989  | Inamasu |
|-----------|---|---|---------|---------|
| 4,947,172 | A |   | 8/1990  | Suzuki |
| 4,998,108 | A |   | 3/1991  | Ginthner et al. |
| 5,534,863 | A | * | 7/1996  | Everitt et al. ........... 341/150 |
| 5,841,386 | A | * | 11/1998 | Leduc ................... 341/143 |
| 5,914,682 | A |   | 6/1999  | Noguchi |
| 6,052,076 | A | * | 4/2000  | Patton et al. ........... 341/144 |
| 6,163,288 | A |   | 12/2000 | Yoshizawa |
| 6,642,875 | B2| * | 11/2003 | Harada et al. .......... 341/144 |

FOREIGN PATENT DOCUMENTS

| DE | 3427852 C2    | 2/1985 |
| DE | 198 52 778 A1 | 7/1999 |
| DE | 100 21 824 A1 | 2/2001 |
| DE | 100 37 937 A1 | 4/2001 |

OTHER PUBLICATIONS

International Search Report (in German), International Application No. PCT/DE02/022652 dated Jul. 18, 2002, 4 pgs.

* cited by examiner

*Primary Examiner*—Brian Young
(74) *Attorney, Agent, or Firm*—Eschweiler & Associates, LLC

(57) ABSTRACT

A digital/analog converter apparatus (DAC) comprises, for the purpose of converting a digital input signal (D) into an analog output signal (A), a first unit (F1, F2), two digital/analog converters (DAC1, DAC2) and a second unit (K1, K2), which are connected successively in the stated order. From the digital input signal (D), digital intermediate signals (D1, D2) which are within the analog output signal (A) is obtained through linear combination.

21 Claims, 6 Drawing Sheets

HIGH-RESOLUTION DIGITAL-TO-ANALOG CONVERTER

RELATED APPLICATION

This application is a national stage application of International Application No. PCT/DE02/02652 filed Jul. 18, 2002, which is entitled "HIGH-RESOLUTION DIGITAL/ANALOG CONVERTER APPARATUS", which was not published in English, and claims priority to German Patent Application Serial No. 101 53 309.8, which was filed on Oct. 29, 2001, which is hereby incorporated by reference in its entirety.

FIELD OF THE INVENTION

The invention relates to a high-resolution digital/analog converter apparatus. The digital/analog converter apparatus is based on two digital/analog converters whose resolution is respectively lower than the resolution of the digital/analog converter apparatus.

BACKGROUND OF THE INVENTION

An important quality feature of a digital/analog converter (DAC) is its resolution. However, the resolution also makes a significant contribution to the manufacturing costs of a digital/analog converter. For this reason, it is an aim, when developing digital/analog converters, to attain a high resolution with a small number of components required for this and with a small area requirement for implementation in an integrated circuit. In addition, the digital/analog converter's power loss in operation needs to be as low as possible.

One class of known digital/analog converters comprises binary-weighted digital/analog converters. By way of example, these can be based on R-2R networks. Such digital/analog converters are distinguished by a particularly small number of components. However, very high demands need to be placed on the equality of the individual resistors in order to avoid nonlinearities. This necessitates a large area requirement in an integrated circuit. Furthermore, it is sometimes necessary to calibrate the resistors in the R-2R network.

Another class of known digital/analog converters contains segmented digital/analog converters. By way of example, segmented digital/analog converters are based on of $2^{resolution}-1$ equal resistors, with the resolution of the segmented digital/analog converter in question being specified in bits. Segmented digital/analog converters have a very high differential linearity and guaranteed monotony of the characteristic. A drawback of segmented digital/analog converters is the very large number of resistors required and an area requirement which grows exponentially with the resolution. For this reason, segmented digital/analog converters are not suitable for use to attain a high resolution.

In addition, it is known practice to increase the resolution of a digital/analog converter using digital signal processing, for example using noise shapers. Such digital signal processing is very complex, however. Noise shapers also have the drawback that their limit cycles can cause unwanted interference signals. In addition, the quantization noise subjected to high-pass filtering by the noise shaper requires subsequent analog low-pass filtering of the output signal. In this case, the analog low-pass filter needs to have a high degree of linearity so that the high-pass filtered quantization noise is not transformed to the useful band through intermodulation. Another drawback of noise shapers is additional power loss caused both by the noise shaper and by the analog low-pass filter.

SUMMARY OF THE INVENTION

It is therefore an object of the invention to provide a digital/analog converter apparatus which can be used to attain a high resolution given a small area requirement and a small number of components.

The object on which the invention is based is achieved by the features of the independent patent claims. Advantageous developments and refinements are specified in the subclaims.

A digital/analog converter apparatus in accordance with the invention is used for the linear transformation of a digital input signal into an analog output signal. The digital/analog converter apparatus has at least two digital/analog converters. Connected upstream of the at least two digital/analog converters is a first unit for range localization. The input side of the first unit is fed the digital input signal. The first unit applies a respective digital intermediate signal, which the first unit respectively generates from the digital input signal, to inputs on the at least two digital/analog converters. The digital intermediate signals are generated such that they are within prescribed ranges. In addition, the inventive digital/analog converter apparatus comprises a second unit, which is connected downstream of the at least two digital/analog converters. The inputs of the second unit are fed analog intermediate signals from outputs on the at least two digital/analog converters. The analog output signal from the digital/analog converter apparatus can be tapped off at an output on the second unit. The second unit generates the analog output signal by forming a linear combination of the analog intermediate signals.

A fundamental advantage of the inventive digital/analog converter apparatus is that it can be used to attain a higher resolution for the analog output signal than that of the at least two digital/analog converters. The increase in the resolution is based on a combination of digital signal processing, which is preferably nonlinear, and linear analog signal processing.

The inventive digital/analog converter apparatus requires much less area for a particular resolution than would be required, by way of example, by a binary-weighted digital/analog converter having the same resolution. The reason for the small space requirement is that there is much less of a demand for equality of the components. In contrast to many binary-weighted digital/analog converters, the inventive digital/analog converter apparatus does not require any calibration of the components.

The number of components which the inventive digital/analog converter apparatus requires in order to attain a high resolution is much smaller than in a segmented digital/analog converter having the same resolution. The smaller number of components likewise results in a smaller area requirement in integrated circuits and a reduction in parasitic capacitances, which simultaneously increases the signal bandwidth of the digital/analog converter apparatus.

Another advantage of the inventive digital/analog converter apparatus is the small number of switches which are necessary in the signal path. This reduces the capacitive crosstalk for digital signals, which in turn allows the sampling rate to be increased.

In contrast to the use of noise shapers, the use of the inventive digital/analog converter apparatus allows an increased resolution given lower power losses, a smaller area requirement and without additional analog low-pass filters and without any disturbing limit cycles.

In line with one particularly preferred refinement of the invention, the nonlinear signal processing in the first unit is used to generate sawtooth-shaped digital intermediate signals. This can be done using a threshold value detector, in particular. The sawtooth-shaped structure makes it a simple matter to localize the digital intermediate signals to the prescribed ranges.

The sawtooth-shaped structures of the digital intermediate signals have equal step lengths. In addition, the signal rises in the sawtooth-shaped structures begin at the same point.

It is also advantageous if the at least two digital/analog converters have different gains and/or different resolutions.

Another advantageous refinement of the invention is characterized in that the second unit has, for each of the at least two digital/analog converters, an amplifier for amplifying the analog intermediate signal which is output by the respective digital/analog converter and in that the amplifiers have different gain factors, in particular. Preferably, a difference and/or a sum is/are formed from the analog intermediate signals amplified in this manner.

To attain as high a resolution as possible for the inventive digital/analog converter apparatus, it is particularly advantageous to design the at least two digital/analog converters such that the ratio of the gains of two respective digital/analog converters is approximately an integer and, in particular, is approximately equal to one.

In addition, the reference voltages for the at least two digital/analog converters may advantageously be chosen to be different. In this case, the reference voltage is required in order to convert a digital signal into an analog signal.

Provided that the at least two digital/analog converters are respectively based on a resistor chain, it is possible to produce different resolutions for the at least two digital/analog converters using a different number of series-connected resistors.

Alternatively, the at least two digital/analog converters may advantageously be based on a common resistor chain.

Preferably, the digital input signal has more significant bits and less significant bits. In addition, the first unit has a plurality of adders for generating each digital intermediate signal. A first digital intermediate signal is generated by adding the more significant bits to the less significant bits, and a second digital intermediate signal is generated by adding the more significant bits to the inverted less significant bits. This way of generating the digital intermediate signals has the advantage that it causes the digital intermediate signals to take on a sawtooth-shaped shape. This makes it unnecessary to integrate, by way of example, a threshold value detector into the digital/analog converter apparatus in order to localize the range for the digital intermediate signals.

It is particularly advantageous to provide the at least two digital/analog converters and the first and second units on a common substrate. By way of example, the inventive digital/analog converter apparatus can be produced using CMOS (Complementary Metal Oxide Semiconductor) technology.

The inventive method is used for the linear conversion of a digital input signal into an analog output signal. To this end, the digital input signal is first used to generate two digital intermediate signals. The digital intermediate signals are generated such that they do not exceed prescribed ranges. Next, the digital intermediate signals are transformed into analog intermediate signals. The analog output signal is generated through linear combination of the analog intermediate signals.

A crucial advantage of the inventive method over conventional methods for digital/analog conversion is that the resolution attained using the inventive method is higher than the resolution of digital/analog conversion of the digital intermediate signals into the analog intermediate signals. Consequently, the inventive method can be used to attain a high resolution particularly inexpensively.

The invention is explained in more detail below by way of example with reference to the drawings, in which:

DETAILED DESCRIPTION OF THE INVENTION

Figure 1:
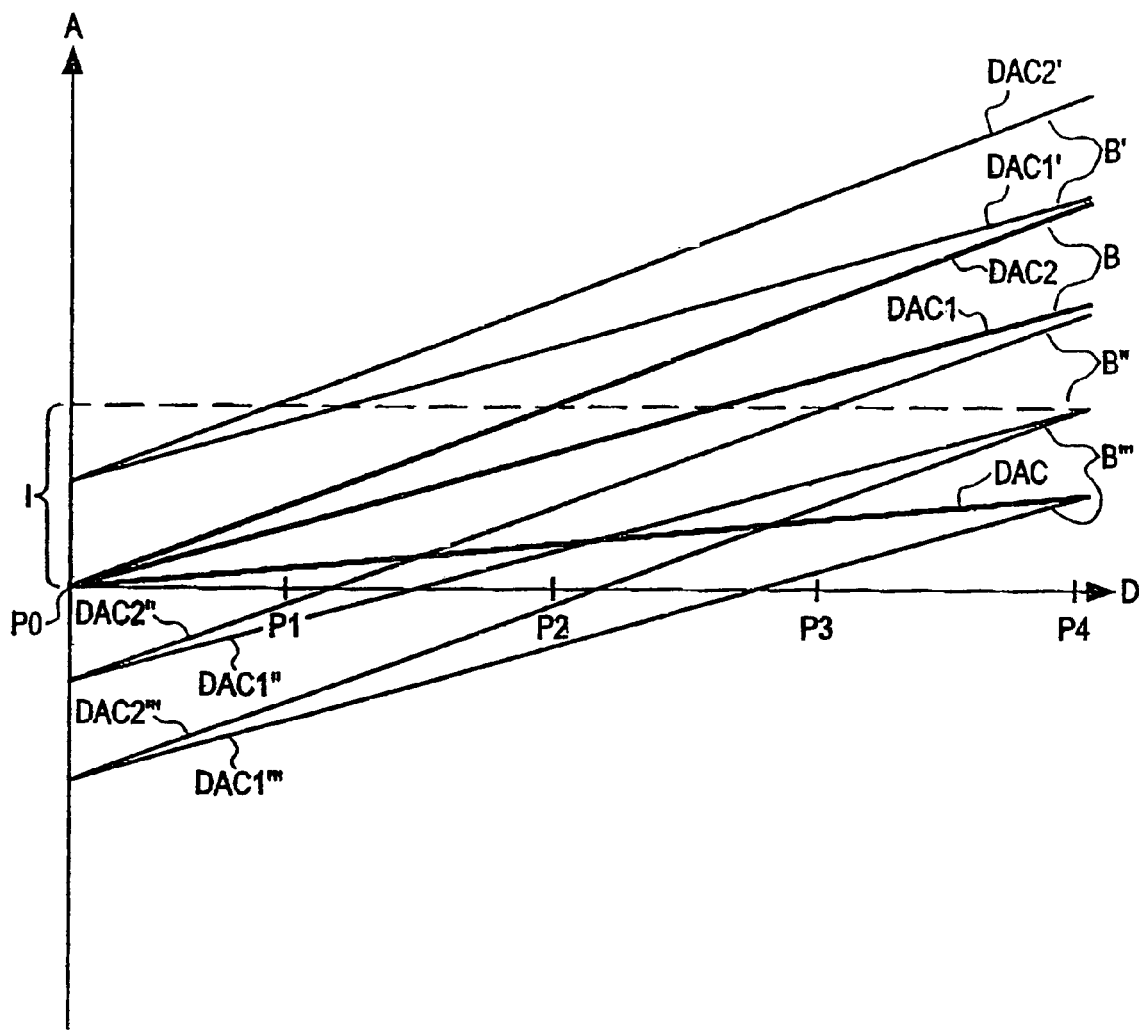
FIG. 1 shows a schematic illustration of the principle of the inventive digital/analog converter apparatus.

FIG. 1 schematically shows the principle on which the inventive digital/analog converter apparatus is based. A digital input signal D is converted linearly into an analog output signal A in a digital/analog converter DAC. In this case, the digital input signal D is normally a binary number and the analog output signal A is a voltage which is proportional to the binary number in question. The proportionality factor is denoted by LSB (Least Significant Bit) and corresponds to the voltage associated with the least significant bit. The following equation therefore applies:

$$A = LSB * D \tag{1}$$

When the analog output signal A is plotted against the digital input signal D, the result for a digital/analog converter DAC is thus a straight line whose gradient is provided by the proportionality factor LSB. The proportionality factor LSB therefore specifies the gain of the digital/analog converter DAC. FIG. 1 plots the transfer characteristics DAC, DAC1 and DAC2 of three different digital/analog converters DAC, DAC1 and DAC2, said transfer characteristics being characterized by proportionality factors LSB, LBS1 and LSB2. By way of example, the proportionality factors LSB, LSB1 and LSB2 have the values 1 mV, 3 mV and 4 mV.

The digital/analog converters DAC, DAC1 and DAC2 have been provided with the same reference symbols as their respective transfer characteristics DAC, DAC1 and DAC2. This practice makes sense, since the digital/analog converters DAC, DAC1 and DAC2 are clearly characterized by their respective transfer characteristics DAC, DAC1 and DAC2.

The transfer characteristic DAC can be generated by subtracting the transfer characteristic DAC1 from the transfer characteristic DAC2. This also applies if the transfer characteristics DAC1 and DAC2 have an additive constant, which is the same for both transfer characterstics DAC1 and DAC2, applied to them and are therefore shifted by the same amount in the direction of the A axis. Subtracting the two transfer characteristics DAC1 and DAC2 consequently allows the transfer characteristic DAC to be obtained regardless of the magnitude of the additive constant, which is the same for both transfer characteristics DAC1 and DAC2. To illustrate this fact, FIG. 1 shows shifted transfer characteristics DAC1' and DAC2', DAC1'' and DAC2'' and also DAC1''' and DAC2''', the transfer characteristics having the same additive constants in respective pairs. In this context, the transfer characteristics with the same additive constant form a respective bundle B, B', B'' or B'''.

On account of the above described invariance in the difference between the transfer characteristics DAC2 and DAC1 with respect to a common additive constant, it is possible to jump between different bundles B, B', B'' and B''' in order to generate the transfer characteristic DAC. By way of example, FIG. 1 shows that the transfer characteristic DAC is obtained when bundle B' is used between points P0 and P1, bundle B' is used between points P1 and P2, bundle B'' is used between points P2 and P3, and bundle B''' is used between P3 and P4. This measure has the advantage that the transfer characteristic DAC is formed only from bundles which are in the range I of the analog output signal A when they are used to generate the transfer characteristic DAC.

Figure 2A:
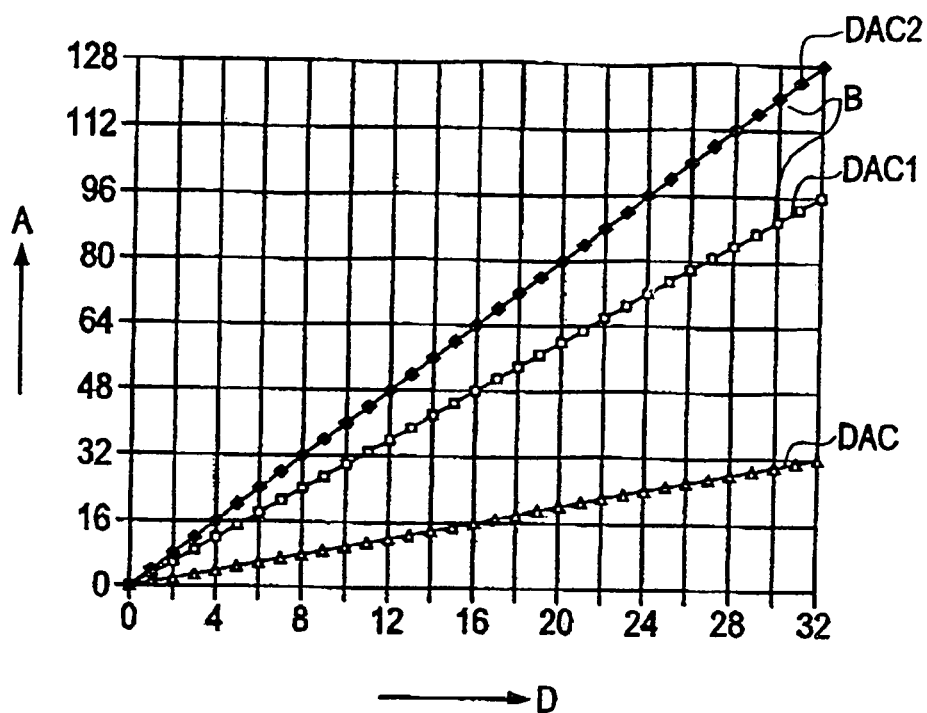
FIGS. 2A and 2B shows transfer characteristics to illustrate the principle of the inventive digital/analog converter apparatus.
Figure 2B:
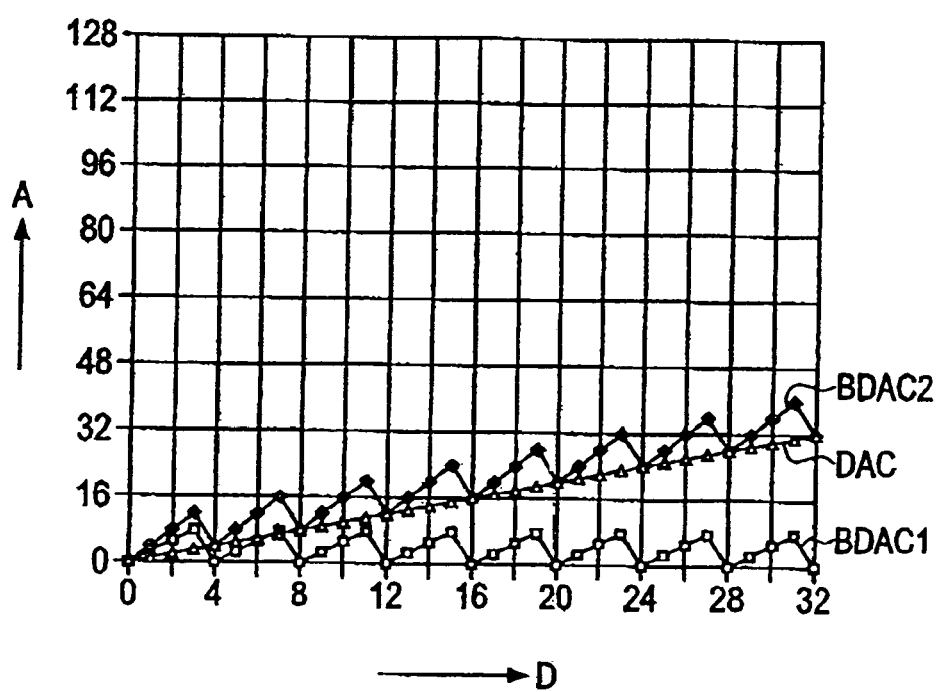

FIGS. 2A and 2B show the above-described practice again by way of example. FIG. 2A shows the original transfer characteristics DAC1 and DAC2, which form the bundle B, and also the transfer characteristic DAC which is generated therefrom. In FIG. 2B, the transfer characteristic DAC comes from the bundle B and from the bundles shifted parallel in the A direction to the bundle B. The transfer characteristic which results from the transfer characteristics DAC1, DAC1', DAC1'' etc., is denoted by BDAC1. Accordingly, the transfer characteristic which is obtained from the transfer characteristics DAC2, DAC2', DAC2'' etc., bears the designation BDAC2. As a result, the transfer characteristic DAC has 32 different voltage values for its analog output signal A over a range of 32 different numerical values for the digital input signal D, whereas the transfer characteristics BDAC1 and BDAC2 require only 4 and 11 different analog voltage values, respectively, in order to generate the transfer characteristic DAC. It follows from this that a digital/analog converter associated with the transfer characteristic DAC and having a resolution of 5 bits is formed from two digital/analog converters which have a resolution of 2 bits and 4 bits, respectively.

So that, as described above, the two digital/analog converters DAC1 and DAC2 produce a digital/analog converter DAC having a higher resolution than that of the digital/analog converters DAC1 and DAC2, the transfer characteristics DAC1 and DAC2 advantageously have different gradients.

Figure 3:
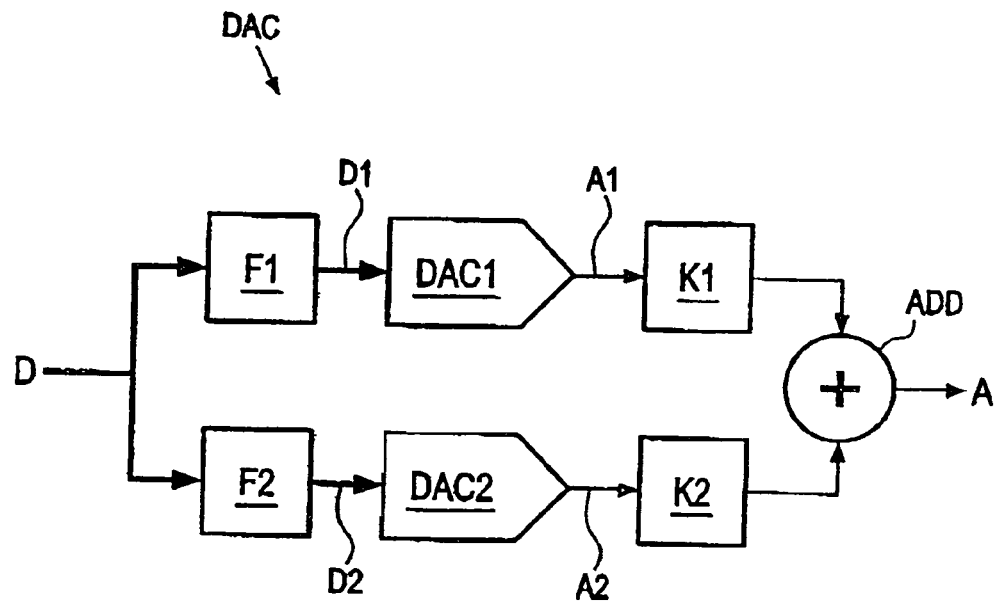
FIG. 3 shows a schematic diagram of a first exemplary embodiment of the inventive digital/analog converter apparatus.

FIG. 3 shows a first exemplary embodiment of the inventive digital/analog converter apparatus DAC in the form of a schematic diagram. The digital/analog converter apparatus DAC comprises digital/analog converters DAC1 and DAC2, units F1 and F2 for digital signal processing, units K1 and K2 for analog signal processing, and an adder ADD. A digital input signal D feeds the units F1 and F2. There, the digital input signal D is processed, particularly on a nonlinear basis, and is then fed into the digital/analog converters DAC1 and DAC2 in the form of digital intermediate signals D1 and D2. Following digital/analog conversion, the analog intermediate signals A1 and A2 obtained therefrom are processed further in analog form by the units K1 and K2 and are summed by the adder ADD. The output of the adder ADD outputs an analog output signal A.

Mathematically, the operation of the present digital/analog converter apparatus DAC can be described as follows. The digital input signal D is subjected to, in particular, nonlinear functions F1 and F2. The resultant digital intermediate signals D1 and D2 are transformed into analog voltages using proportionality factors LSB1 and LSB2, and the analog intermediate signals A1 and A2 obtained therefrom are used to form a linear combination with coefficients k1 and k2, whose result represents the analog output signal A. This can be summarized as a mathematical equation as follows:

$$A = k1*LSB1*f1(D) + k2*LSB2*f2(D) \tag{2}$$

One of the two summands in equation (2) may also have a negative arithmetic sign, which means that a subtraction is the overall result. In this context, the negative arithmetic sign may be provided, by way of example, by the coefficients k1 or k2 or by the functions f1 or f2.

The aforementioned measure, according to which the transfer characteristics DAC1 and DAC2 advantageously have different gradients, can be implemented using different coefficients k1 and k2 or using different proportionality factors LSB1 and LSB2 or using different reference voltages for the digital/analog converters DAC1 and DAC2.

To generate a "smooth" transfer characteristic DAC, it is particularly crucial that the levels of the steps which respectively occur in sync with one another, as are shown in FIG. 2B, for example, within the transfer characteristics BDAC1 and BDAC2 match exactly. Otherwise, the result would be discontinuities in the transfer characteristic DAC. To achieve this aim, it is particularly advantageous if the two digital/analog converters DAC1 and DAC2 come from the same circuit structure. If the digital/analog converters DAC1 and DAC2 are based on series-connected resistors, it is advantageous to use a common resistor chain for the two digital/analog converters DAC1 and DAC2. Possible faults within the resistor chain are thus canceled out again.

Figure 4:
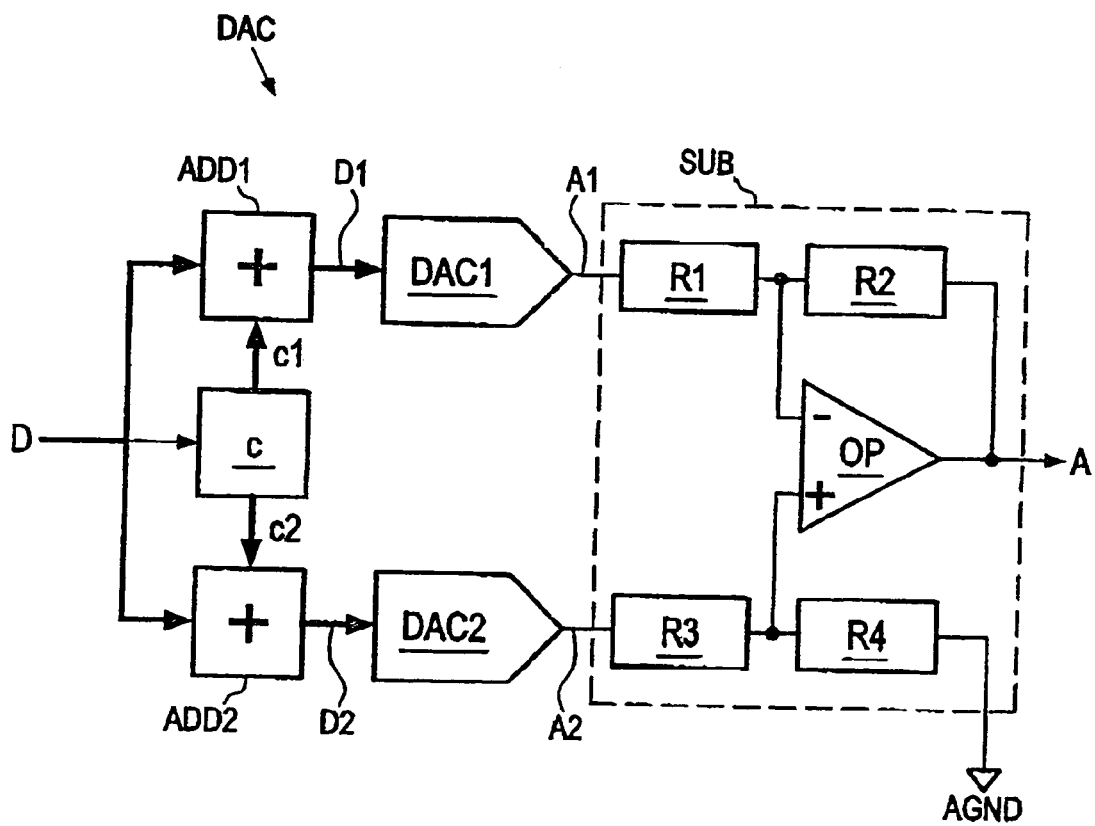
FIG. 4 shows a schematic diagram of a second exemplary embodiment of the inventive digital/analog converter apparatus.

FIG. 4 shows a schematic diagram of a second exemplary embodiment of the inventive digital/analog converter apparatus DAC. The present second exemplary embodiment consolidates the first exemplary embodiment shown in FIG. 3. In the second exemplary embodiment, functions c1 and c2 are added to the digital input signal D in adders ADD1 and ADD2 before the resultant digital intermediate signals D1 and D2 feed the inputs of the digital/analog converters DAC1 and DAC2. The functions c1 and c2 are generated in a unit C. By way of example, the functions c1 and c2 may be step functions. The step functions ensure that the transfer characteristics BDAC1 and BDAC2 are within particular ranges. Connected downstream of the digital/analog converters DAC1 and DAC2 is a subtractor SUB which has an operational amplifier OP and resistors R1, R2, R3 and R4. A suitable choice of the sizes of the resistors R1, R2, R3 and R4 allow the coefficients k1 and k2 to be set in the present exemplary embodiment.

Figure 5:
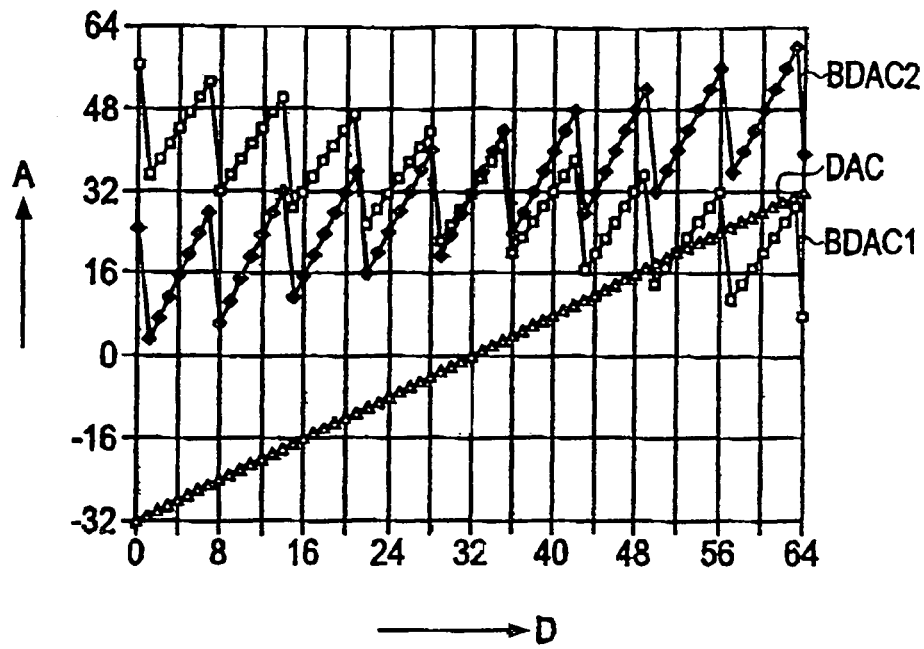
FIG. 5 shows transfer characteristics for the second exemplary embodiment.

A possible transfer characteristic DAC for the second exemplary embodiment, which transfer characteristic comes from the transfer characteristics BDAC1 and BDAC2, is shown in FIG. 5.

Figure 6:
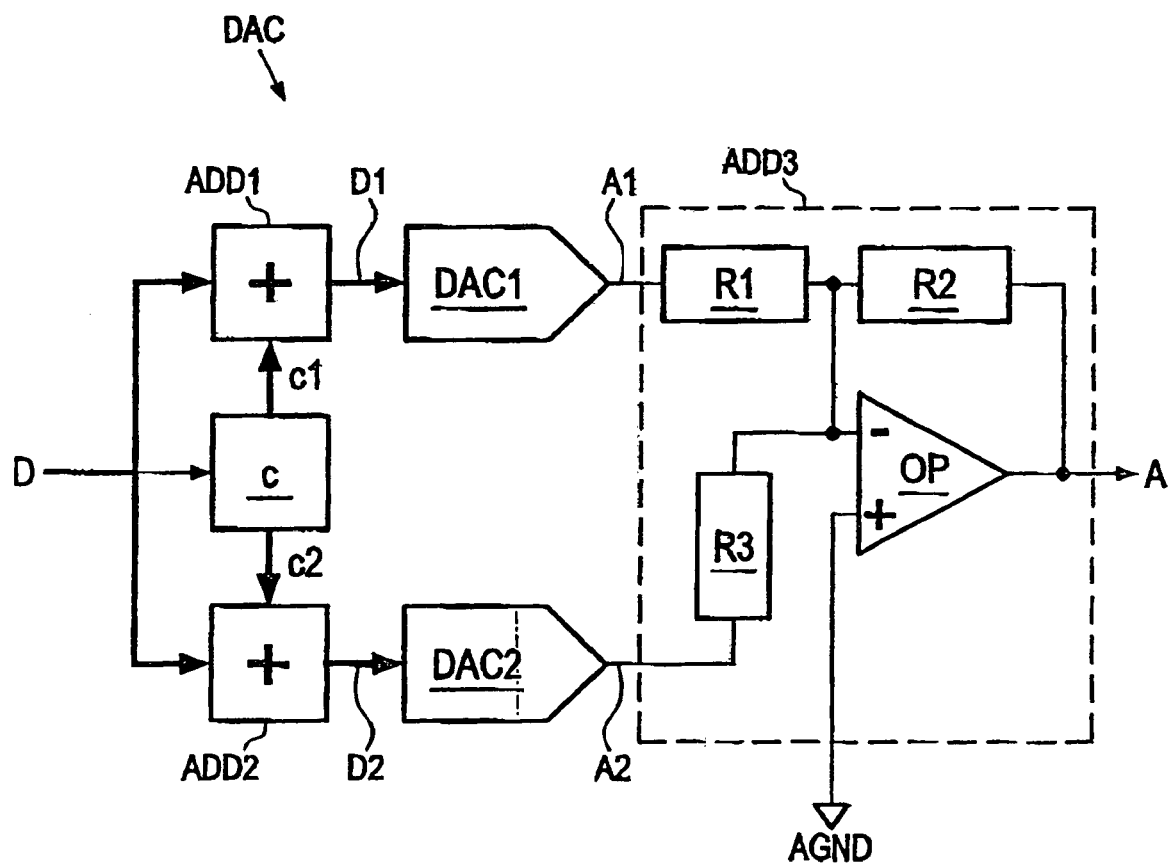
FIG. 6 shows a schematic diagram of a third exemplary embodiment of the inventive digital/analog converter apparatus.

FIG. 6 shows a schematic diagram of a third exemplary embodiment of the inventive digital/analog converter apparatus DAC. The third exemplary embodiment differs from the second exemplary embodiment shown in FIG. 4 in that, to form the analog output signal A, the digital/analog converters DAC1 and DAC2 have an adder ADD3, which has an operational amplifier OP and resistors R1, R2 and R3, connected downstream of them. By providing suitable proportions for the resistors R1, R2 and R3, it is possible to stipulate the coefficients k1 and k2.

Figure 7:
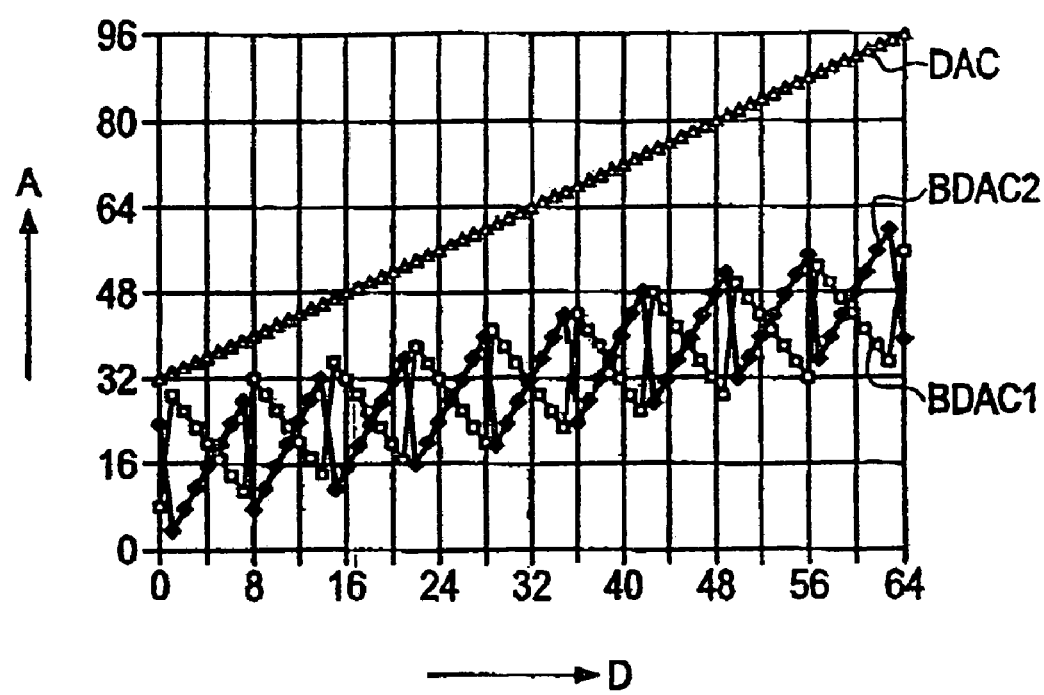
FIG. 7 shows transfer characteristics for the third exemplary embodiment.

A possible transfer characteristic DAC for the third exemplary embodiment, which transfer characteristic comes from the transfer characteristics BDAC1 and BDAC2, is shown in FIG. 7.

Figure 8:
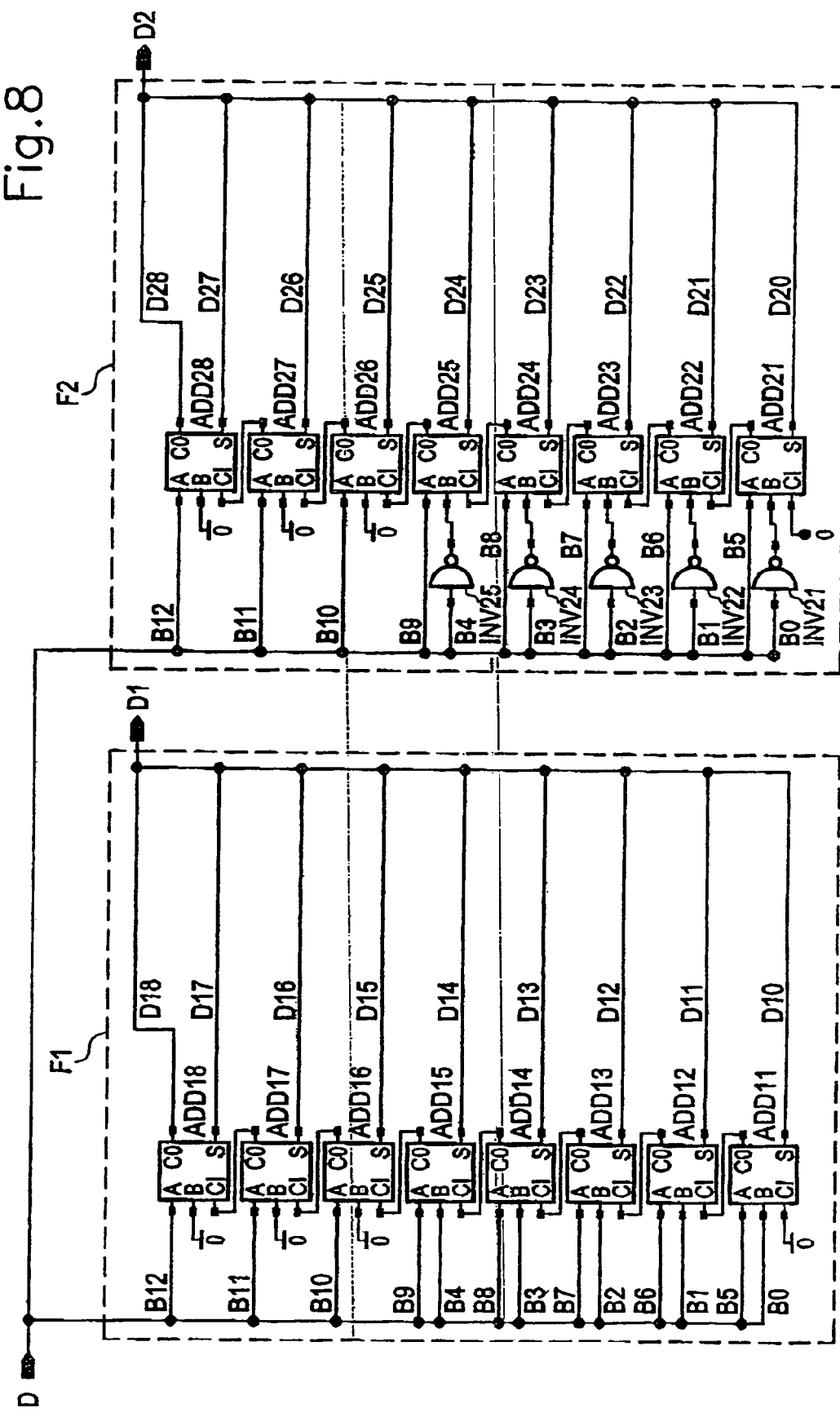
FIG. 8 shows a schematic diagram of a circuit for generating digital intermediate signals.

FIG. 8 shows a schematic diagram of a circuit which can be used to generate the digital intermediate signals D1 and D2 from the digital input signal D. To this end, the digital input signal D feeds two units F1 and F2 for digital signal processing. The unit F1 or F2 contains adders ADD11, . . . , ADD18 or ADD21, . . . , ADD28. The digital 13-bit input signal D is split into two digital signal components which each contain more significant bits B5, . . . , B12 and less significant bits B0, . . . , B4. The bits B0, . . . , B12 respectively feed inputs A and B on the adders ADDxy (where x=1, 2 and y=1, . . . , 8). The adders ADD11, . . . , ADD18 add the more significant bits B5, . . . , B12 to the less significant bits B0, . . . , B4 and thus generate the digital intermediate signal D1. The adders ADD21, . . . , ADD28 add the more significant bits B5, . . . , B12 to the respectively inverted less significant bits B0, . . . , B4 and thus generate a digital intermediate signal D2. To this end, the inputs B of the adders ADD21, . . . , ADD25 have a respective inverter INV21, . . . , INV25 connected upstream of them. If carries are generated during binary addition, these are output at outputs CO on an adder ADDxy. The output CO of the adder ADDxy is connected to an input CI on the adder ADDx(y+1). As a departure from this, the inputs CI on the adders ADDx1 have a logic value zero 0 applied to them, and the outputs CO of the adders ADDx8 are connected to the output of the units F1 and F2.

An adder ADDxy adds the values which are applied to its inputs A, B and CI. The calculated sum is output at an output S. If the addition produces a carry for the next significant bit, the carry is forwarded via the output CO to the adder ADDx(y+1), which includes it in the addition. The bits Dxz (where x=1, 2 and z=0, . . . , 8) which are output at the outputs S and the outputs CO of the adder ADDx8 produce the digital 9-bit intermediate signal D1 or D2 in each of the units F1 and F2. The digital intermediate signals D1 and D2 are the output signals from the units F1 and F2.

The advantage of the circuit shown in FIG. 8 is that it can be used to generate digital intermediate signals D1 and D2 which satisfy the inventive range restrictions for the digital intermediate signals D1 and D2. As a result, the present circuit delivers digital intermediate signals D1 and D2 which have a sawtooth-shaped structure. This result is attained solely by connecting the adders ADDxy as shown and without the assistance of a threshold value detector.

What is claimed is:

1. A digital/analog converter apparatus (DAC) for the linear conversion of a digital input signal (D) into an analog output signal (A), having
  at least two digital/analog converters (DAC1, DAC2),
  a first unit (F1, F2), which is connected upstream of the at least two digital/analog converters (DAC1, DAC2) and is in a form such that it feeds inputs on the at least two digital/analog converters (DAC1, DAC2) with digital intermediate signals (D1, D2), coming from a digital input signal (D), and such that the digital intermediate signals (D1, D2) are within prescribed ranges (I), and
  a second unit (K1, K2, ADD), which is connected downstream of the at least two digital/analog converters (DAC1, DAC2) and is a form such that it forms the analog output signal (A) from a linear combination of analog intermediate signals (A1, A2) which can be tapped off at outputs on the at least two digital/analog converters (DAC1, DAC2).

2. The digital/analog converter apparatus (DAC) as claimed in claim 1, characterized
  in that the first unit (F1, F2) generates the digital intermediate signals (D1, D2) through nonlinear digital signal processing of the digital input signal (D).

3. The digital/analog converter apparatus (DAC) as claimed in claim 2, characterized
  in that the first unit (F1, F2) generates sawtooth-shaped digital intermediate signals (D1, D2), particularly using a threshold value detector.

4. The digital/analog converter apparatus (DAC) as claimed in any one of the preceding claims, characterized
  in that the at least two digital/analog converters (DAC1, DAC2) have different gains and/or different resolutions.

5. The digital/analog converter apparatus (DAC) as claimed in any one of the preceding claims, characterized
  in that the second unit (K1, K2, ADD) has, for each of the at least two digital/analog converters (DAC1, DAC2), an amplifier for amplifying its analog intermediate signal (A1, A2), with the amplifiers having different gain factors, in particular.

6. The digital/analog converter apparatus (DAC) as claimed in claim 5, characterized
  in that the second unit (K1, K2, ADD) is in a form such that it forms a difference and/or a sum for the amplified analog intermediate signals.

7. The digital/analog converter apparatus (DAC) as claimed in any one of claims 4 to 6, characterized
  in that the ratio of the gains of two respective digital/analog converters (DAC1, DAC2) is approximately an integer.

8. The digital/analog converter apparatus (DAC) as claimed in any one of claims 4 to 7, characterized
  in that the ratio of the gains of two respective digital/analog converters (DAC1, DAC2) is approximately equal to one.

9. The digital/analog converter apparatus (DAC) as claimed in any one of the preceding claims, characterized
  in that the at least two digital/analog converters (DAC1, DAC2) have different reference voltages.

10. The digital/analog converter apparatus (DAC) as claimed in any one of the preceding claims, characterized
  in that the at least two digital/analog converters (DAC1, DAC2) are based on the principle of series-connected resistors, with the at least two digital/analog converters (DAC1, DAC2) having different numbers of series-connected resistors.

11. The digital/analog converter apparatus (DAC) as claimed in any one of claims 1 to 9, characterized
  in that the at least two digital/analog converters (DAC1, DAC2) are based on the principle of series-connected resistors and have a common resistor chain.

12. The digital/analog converter apparatus (DAC) as claimed in any one of the preceding claims, characterized
  in that the digital input signal (D) has more significant bits (B5, . . . , B12) and less significant bits (B0, . . . , B4), and
  in that the first unit (F1, F2) generates each digital intermediate signal (Dl, D2) using a plurality of adders (ADDxy), the adders (ADDxy) being designed such that a first digital intermediate signal (D1) is generated by adding the more significant bits (B5, ..., B12) to the less significant bits (B0, ..., B4), and that a second digital intermediate signal (D2) is generated by adding the more significant bits (B5, ..., B12) to the inverted less significant bits (B0, ..., B4).

13. The digital/analog converter apparatus (DAC) as claimed in any one of the preceding claims, characterized
in that the at least two digital/analog converters (DAC1, DAC2), the first unit and the second unit are integrated on a common substrate.

14. A method for the linear conversion of a digital input signal (D) into an analog output signal (A), having the following method steps:
   (1) a first digital intermediate signal (D1) and a second digital intermediate signal (D2) are generated through digital signal processing of the digital input signal (D), with the two digital intermediate signals (D1, D2) being generated such that they are within prescribed ranges (I);
   (2) the first digital intermediate signal (D1) is subjected to digital/analog conversion to give a first analog intermediate signal (A1), and the second digital intermediate signal (D2) is subjected to digital/analog conversion to give a second analog intermediate signal (A2); and
   (3) the analog output signal (A) is generated from linear combination of the two analog intermediate signals (A1, A2).

15. The method as claimed in claim 14, characterized
in that the two digital intermediate signals (Dl, D2) are generated through nonlinear digital signal processing of the digital input signal (D).

16. The method as claimed in claim 15, characterized
in that the two digital intermediate signals (D1, D2) are sawtooth-shaped.

17. The method as claimed in any one of claims 14 to 16, characterized
in that the two digital intermediate signals (D1, D2) are converted into the two analog intermediate signals (A1, A2) using different gains and/or using different resolutions.

18. The method as claimed in any one of claims 14 to 17, characterized
in that method step (3) involves the two analog intermediate signals (A1, A2) being amplified, this being done using different gain factors, in particular.

19. The method as claimed in claim 18, characterized
in that method step (3) involves a sum and/or a difference for the two amplified analog intermediate signals (A1, A2) being formed.

20. The method as claimed in any one of claims 17 to 19, characterized
in that the ratio of the gains of the two digital intermediate signals (D1, D2) during the digital/analog conversion is approximately an integer.

21. The method as claimed in any one of claims 17 to 20, characterized
in that the ratio of the gains of the two digital intermediate signals (D1, D2) during the digital/analog conversion is approximately equal to one.

* * * * *

UNITED STATES PATENT AND TRADEMARK OFFICE
CERTIFICATE OF CORRECTION

PATENT NO. : 6,995,700 B2
APPLICATION NO. : 10/493298
DATED : February 7, 2006
INVENTOR(S) : Frederic Roger and Ralf-Rainer Schledz It is certified that error appears in the above-identified patent and that said Letters Patent is hereby corrected as shown below:

Replace Claims To Read –

1. A digital/analog converter apparatus for the linear conversion of a digital input signal into an analog output signal, comprising:
   at least two digital/analog converters,
   a first unit which is connected upstream of the at least two digital/analog converters and is in a form such that it feeds inputs of the at least two digital/analog converters with digital intermediate signals based on the digital input signal, and such that the digital intermediate signals are within prescribed ranges, and
   a second unit which is connected downstream of the at least two digital/analog converters and is a form such that it forms the analog output signal from a linear combination of analog intermediate signals which are outputs of the at least two digital/analog converters
   wherein the first unit generates the digital intermediate signals through nonlinear digital signal processing of the digital input signal, and
   wherein the first unit generates sawtooth-shaped digital intermediate signals using a threshold value detector.

2. The digital/analog converter apparatus as claimed in claim 1, wherein the at least two digital/analog converters have different gains or different resolutions or both different gains and different resolutions.

3. The digital/analog converter apparatus as claimed in claim 1, wherein the second unit, for each of the at least two digital/analog converters, comprises an amplifier for amplifying its analog intermediate signal, with the amplifiers having different gain factors.

4. The digital/analog converter apparatus as claimed in claim 3, wherein the second unit is in a form such that it forms a difference or a sum of the amplified analog intermediate signals.

5. The digital/analog converter apparatus as claimed in claim 2, wherein the ratio of the gains of two respective digital/analog converters is approximately an integer.

6. The digital/analog converter apparatus as claimed in claim 2, wherein the ratio of the gains of two respective digital/analog converters is approximately equal to one.

7. The digital/analog converter apparatus as claimed in claim 1, wherein the at least two digital/analog converters have different reference voltages.

UNITED STATES PATENT AND TRADEMARK OFFICE
CERTIFICATE OF CORRECTION

| | |
|---|---|
| PATENT NO. | : 6,995,700 B2 |
| APPLICATION NO. | : 10/493298 |
| DATED | : February 7, 2006 |
| INVENTOR(S) | : Frederic Roger and Ralf-Rainer Schledz |

It is certified that error appears in the above-identified patent and that said Letters Patent is hereby corrected as shown below:

Replace Claims to Read –

8. The digital/analog converter apparatus as claimed in claim 1, wherein the at least two digital/analog converters comprise series-connected resistors, with the at least two digital/analog converters having different numbers of series-connected resistors.

9. The digital/analog converter apparatus as claimed in claim 1, wherein the at least two digital/analog converters comprise series-connected resistors and have a common resistor chain.

10. The digital/analog converter apparatus as claimed in claim 1, wherein the digital input signal has more significant bits and less significant bits, and
wherein the first unit generates each digital intermediate signal using a plurality of adders, the adders being designed such that a first digital intermediate signal is generated by adding the more significant bits to the less significant bits, and that a second digital intermediate signal is generated by adding the more significant bits to the inverted less significant bits.

11. The digital/analog converter apparatus as claimed in claim 1, wherein the at least two digital/analog converters, the first unit and the second unit are integrated on a common substrate.

12. A method for the linear conversion of a digital input signal into an analog output signal, comprising:
(1) generating a first digital intermediate signal and a second digital intermediate signal through digital signal processing of the digital input signal, with the two digital intermediate signals being generated such that they are within prescribed ranges;
(2) subjecting the first digital intermediate signal to digital/analog conversion to give a first analog intermediate signal, and subjecting the second digital intermediate signal to digital/analog conversion to give a second analog intermediate signal; and
(3) generating the analog output signal from a linear combination of the two analog intermediate signals, wherein generating the two digital intermediate signals comprises generating through nonlinear digital signal processing of the digital input signal, and wherein the two digital intermediate signals are sawtooth-shaped.

13. The method as claimed in claim 12, wherein the two digital intermediate signals are converted into the two analog intermediate signals using different gains or using different resolutions or different gains and different resolutions.

UNITED STATES PATENT AND TRADEMARK OFFICE
CERTIFICATE OF CORRECTION

| | | |
|---|---|---|
| PATENT NO. | : 6,995,700 B2 | |
| APPLICATION NO. | : 10/493298 | |
| DATED | : February 7, 2006 | |
| INVENTOR(S) | : Frederic Roger and Ralf-Rainer Schledz | |

It is certified that error appears in the above-identified patent and that said Letters Patent is hereby corrected as shown below:

Replace Claims to Read –

14. The method as claimed in claim 12, wherein method step (3) further comprises amplifying the two analog intermediate signals using different gain factors.

15. The method as claimed in claim 14, wherein method step (3) further comprises calculating a sum or a difference of the two amplified analog intermediate signals.

16. The method as claimed in claim 13, wherein the ratio of the gains of the two digital intermediate signals during the digital/analog conversion is approximately an integer.

17. The method as claimed in claim 13, wherein the ratio of the gains of the two digital intermediate signals during the digital/analog conversion is approximately equal to one.

18. The method as claimed in claim 12, wherein the digital/analog conversion of the two digital intermediate signals is performed using different reference voltages.

19. The method as claimed in claim 12, wherein the digital/analog conversion of the two digital intermediate signals is performed using digital/analog converters comprising series-connected resistors and which have different numbers of the series-connected resistors.

20. The method as claimed in claim 12, wherein the digital/analog conversion of the two digital intermediate signals is performed using digital/analog converters comprising series-connected resistors and which have a common resistor chain.

UNITED STATES PATENT AND TRADEMARK OFFICE
CERTIFICATE OF CORRECTION

PATENT NO. : 6,995,700 B2
APPLICATION NO. : 10/493298
DATED : February 7, 2006
INVENTOR(S) : Frederic Roger and Ralf-Rainer Schledz It is certified that error appears in the above-identified patent and that said Letters Patent is hereby corrected as shown below:

Replace Claims to Read –

21. The method as claimed in claim 12, wherein the digital input signal has more significant bits and less significant bits, and wherein each digital intermediate signal is generated using a plurality of adders, the adders being designed such that the first digital intermediate signal is generated by adding the more significant bits to the less significant bits, and that the second digital intermediate signal is generated by adding the more significant bits to the inverted less significant bits.

Signed and Sealed this

Twentieth Day of March, 2007

JON W. DUDAS
*Director of the United States Patent and Trademark Office*